(12) United States Patent
Ogure et al.

(10) Patent No.: US 6,391,775 B1
(45) Date of Patent: May 21, 2002

(54) METHOD OF FORMING EMBEDDED COPPER INTERCONNECTIONS AND EMBEDDED COPPER INTERCONNECTION STRUCTURE

(75) Inventors: Naoaki Ogure; Hiroaki Inoue, both of Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/660,411

(22) Filed: Sep. 12, 2000

Related U.S. Application Data

(62) Division of application No. 09/156,903, filed on Sep. 18, 1998, now Pat. No. 6,147,408.

(30) Foreign Application Priority Data

Sep. 18, 1997 (JP) ............................................. 9-272001

(51) Int. Cl.⁷ ................................................. H01L 21/44
(52) U.S. Cl. ........................ 438/687; 438/640; 438/638
(58) Field of Search ................................. 438/687, 686, 438/608, 644, 640, 638

(56) References Cited

U.S. PATENT DOCUMENTS

| | | | |
|---|---|---|---|
| 4,922,321 A | 5/1990 | Arai et al. | 257/751 |
| 5,071,518 A | 12/1991 | Pan | 257/762 |
| 5,250,120 A | 10/1993 | Takada et al. | 257/762 |
| 5,406,120 A | 4/1995 | Jones | 257/774 |
| 5,545,927 A | 8/1996 | Farooq et al. | 257/762 |
| 5,763,953 A * | 6/1998 | Iijima et al. | 257/762 |
| 6,214,728 B1 * | 4/2001 | Chan et al. | 438/678 |
| 6,291,082 B1 * | 9/2001 | Lopatin | 428/621 |

FOREIGN PATENT DOCUMENTS

JP          06006012          1/1994

\* cited by examiner

*Primary Examiner*—Caridad Everhart
(74) *Attorney, Agent, or Firm*—Wenderoth, Lind & Ponack, L.L.P.

(57) ABSTRACT

Embedded interconnections of copper are formed by forming an insulating layer, forming embedded interconnections of copper in the insulating layer, making an exposed upper surface of the insulating layer and an exposed surface of the embedded interconnections of copper coplanar according to chemical mechanical polishing, and forming a protective silver film on the exposed surface of the embedded interconnections of copper. These steps are repeated on the existing insulating layer thereby to produce multiple layers of embedded interconnections of copper. The exposed surface of the embedded interconnections of copper is plated with silver according to immersion plating.

4 Claims, 4 Drawing Sheets

F I G. 2
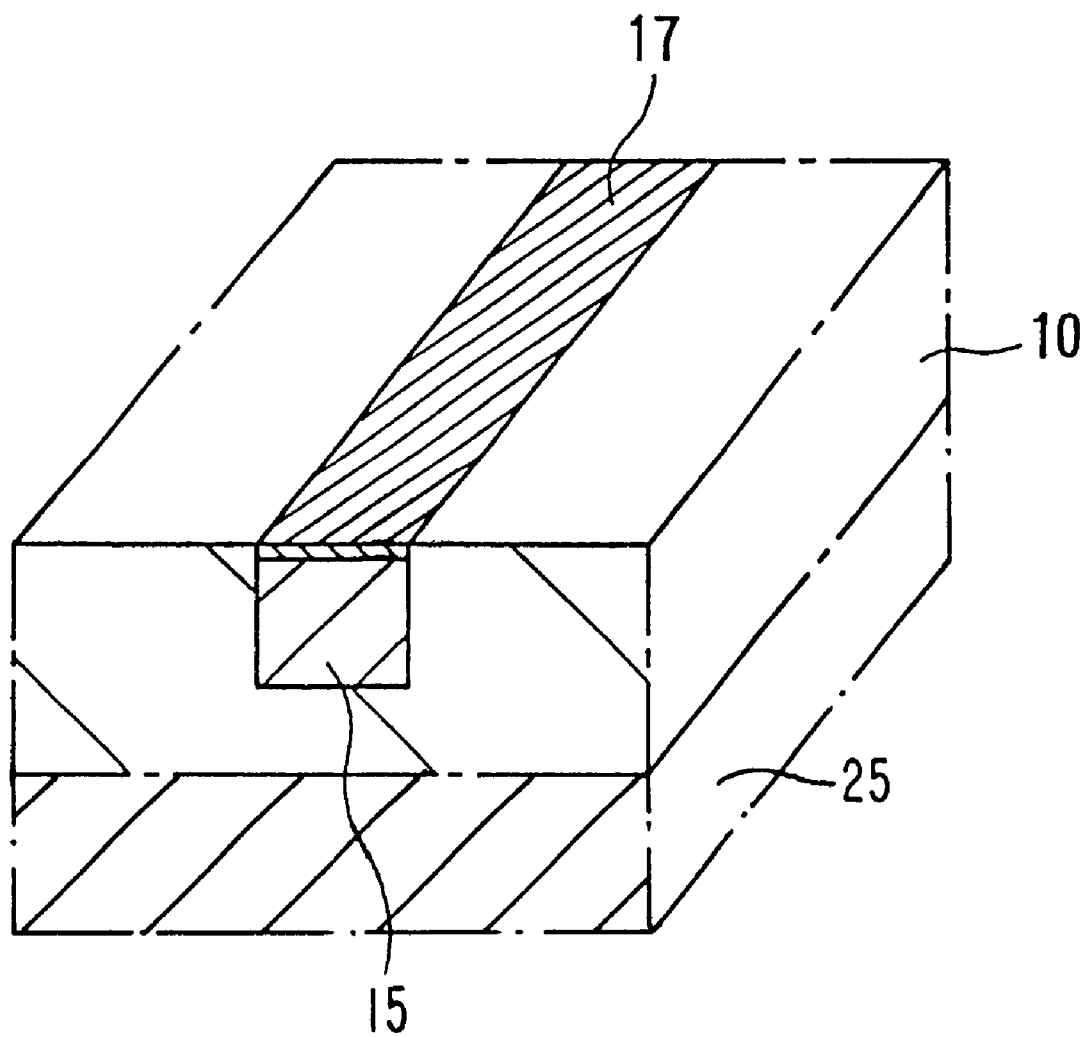

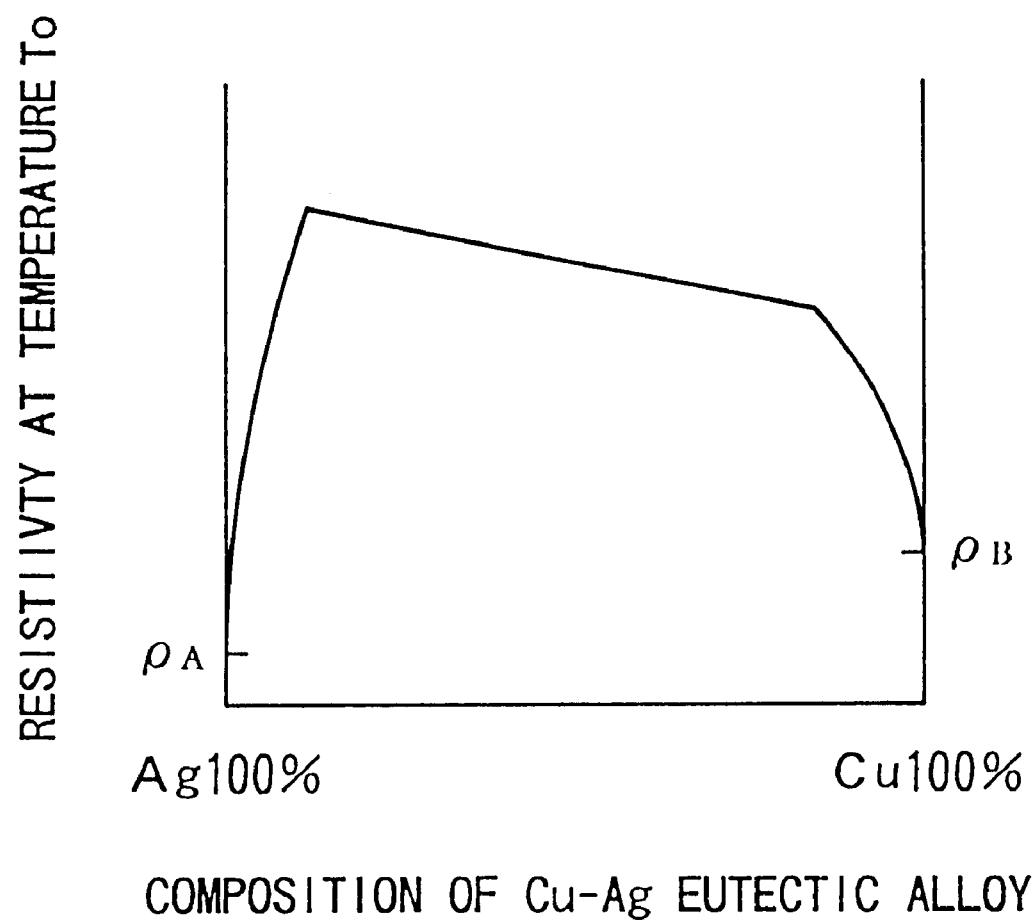

METHOD OF FORMING EMBEDDED COPPER INTERCONNECTIONS AND EMBEDDED COPPER INTERCONNECTION STRUCTURE

This application is a division of U.S. Ser. No. 09/156,903 Sep. 18, 1998, now U.S. Pat. No. 6,147,408.

BACKGROUND OF THE INVENTION

1. Field of the Invention

The present invention relates to a method of forming embedded interconnections of copper on a surface of a substrate such as a semiconductor wafer, and a structure of such embedded interconnections of copper.

2. Description of the Related Art

Generally, aluminum alloys have heretofore been used as the materials of interconnections for use in semiconductor devices. For lower electric resistance and greater migration resistance, however, embedded interconnections of copper produced by a damascene process, and such embedded interconnections of copper arranged in multiple layers are employed.

Conventional multilayer embedded interconnections of copper have suffered various problems. Such problems will be described below with reference to FIGS. 1A through 1C of the accompanying drawings which illustrate a process of successive steps of forming multilayer embedded interconnections of copper. As shown in FIG. 1A, an interconnection 111 of copper is embedded in the upper surface of an insulating layer 110 of silicon dioxide ($SiO_2$). Another insulating layer 120 of silicon dioxide ($SiO_2$) is disposed on the insulating layer 110 and the interconnections 111 for insulating the interconnections of copper (Cu) 111 in an upper layer. When the insulating layer 120 is deposited on the interconnections layer 111, an exposed upper surface 111a of the interconnections 111 is undesirably oxidized by oxygen.

As shown in FIG. 1B, an etchant (etching gas) is applied to etch the insulating layer 120 through a hole 131 defined in a resist layer pattern 130 on the surface of the insulating layer 120 for thereby forming a hole 121 in the insulating layer 120, which will be filled with a plug for connection to the interconnections 111. When the insulating layer 120 is thus etched, the exposed upper surface 111 a of the interconnections 111 is undesirably modified in the composition by the etchant.

As shown in FIG. 1C, when the resist layer 130 (see FIG. 1B) is removed using oxygen, the exposed upper surface 111a of the interconnections 111 is undesirably oxidized by the applied oxygen.

SUMMARY OF THE INVENTION

It is therefore an object of the present invention to provide a method of forming embedded interconnections of copper while effectively preventing the exposed surface of an interconnections of copper from being modified or oxidized.

Another object of the present invention is to provide an embedded copper interconnection structure.

According to the present invention, a method of forming embedded interconnections of copper comprises the steps of: forming an insulating layer; forming embedded interconnections of copper in the insulating layer; planarizing (making coplanar) an exposed surface of the insulating layer including an exposed surface of the embedded interconnections of copper; and forming a protective film of silver on the exposed surface of the embedded interconnections of copper. The protective film of silver on the embedded interconnections of copper prevents the embedded interconnections of copper from being oxidized and prevents the surface thereof from being modified.

To form the protective film of silver on the exposed surface of the embedded interconnections of copper, the exposed surface of the embedded interconnections of copper may be plated with silver according to for example, immersion plating. The immersion plating allows the protective film of silver to be selectively formed only on the exposed surface of the embedded interconnections of copper, and also allows the protective film of silver to be formed in a very small thickness. Therefore, the amount of silver in the protective silver film may be relatively small. Since the protective film of silver and the embedded interconnections of copper do not form a solid solution, the electrical resistance of the embedded interconnections remains relatively low even if silver and copper are diffused in each other.

According to the present invention, an embedded copper interconnection structure comprises a substrate, a first insulating layer disposed on the substrate, an embedded interconnection of copper disposed in the first insulating layer, a protective film of silver disposed on the embedded interconnections of copper in the first insulating layer. The structure also includes a second insulating layer disposed on a surface of the first insulating layer including the embedded interconnections of copper having the protective film of silver thereon.

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIG. 2 is a perspective view illustrative of a process of forming a protective film of silver (Ag) on interconnections of copper disposed in the surface of an insulating layer of $SiO_2$, according to the present invention;

FIG. 3 is a diagram showing the relationship between the composition of a eutectic alloy of copper and silver and the resistivity at a certain temperature;

DETAILED DESCRIPTION OF THE PREFERRED EMBODIMENT

As shown in FIG. 2, interconnections 15 of copper are formed by plating so as to be embedded in the surface of an insulating layer 10 of $SiO_2$ on the surface of a semiconductor wafer (or substrate) 25. The entire upper surface of the insulating layer 10 including the exposed upper surface of the interconnections 15 is made planar by chemical mechanical polishing (CMP) (the upper surface being defined as the surface facing away from the substrate). The semiconductor wafer is then dipped in an aqueous solution of silver cyanide to plate only the exposed surface of the interconnections 15 with a thin protective film 17 of silver (Ag) according to immersion plating. The protective film 17 is shown exaggerated as having an appreciably large thickness in FIG. 2, although it has a very small actual thickness on the exposed upper surface of the interconnections 15.

The immersion plating for forming the protective film 17 is carried out according to the following formula:

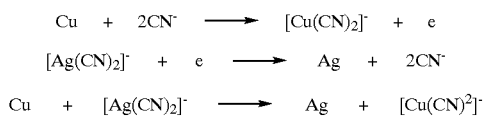

The silver cyanide reacts only with the copper of the interconnections 15, but not with the silicon dioxide of the insulating layer 10. Therefore, during the immersion plating, the protective film 17 is selectively formed only on the exposed upper surface of the interconnections 15.

The immersion plating allows the protective film 17 to be formed in a very small thickness, and may require only a relatively small amount of silver for the protective film 17.

FIG. 3 shows the relationship between compositions of a eutectic alloy of copper and silver, which do not form a solid solution, and the resistivity at a certain temperature $T_0$. It can be seen from FIG. 3 that if the concentration of copper in the eutectic alloy is close to 100% (point $\rho_B$), then the resistance of the eutectic alloy is substantially the same small value as if the concentration of copper is 100%. Therefore, since the protective film 17 is very thin and contains a relatively small amount of silver, the overall resistance of the interconnections 15 remains essentially unchanged even if silver and copper diffuse in each other.

Figure 1A:
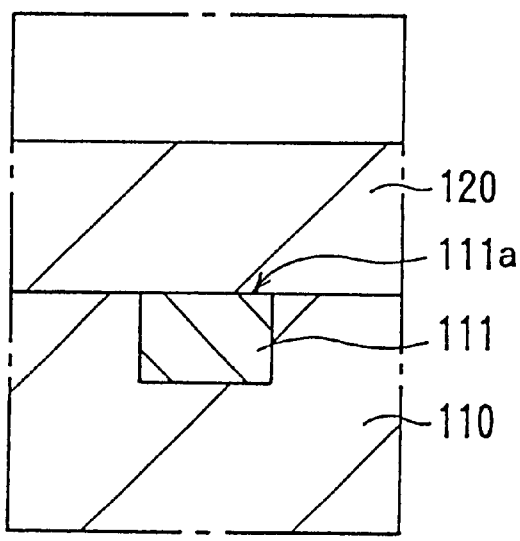
FIGS. 1A through 1C are fragmentary cross-sectional views showing a conventional process of successive steps of forming multilayer embedded interconnections of copper.
Figure 1B:
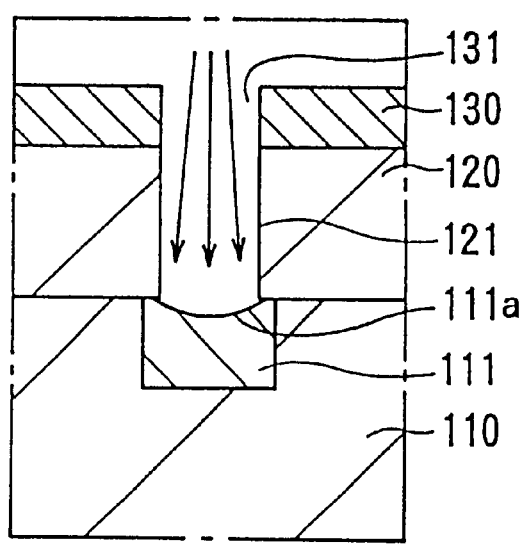
Figure 1C:
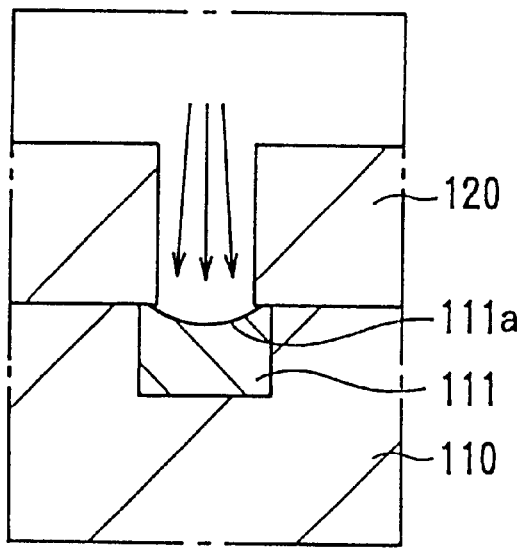
Figure 4A:
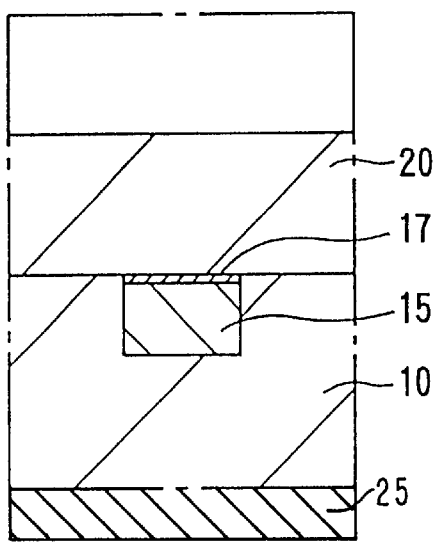
FIGS. 4A through 4D are fragmentary cross-sectional views showing the manner in which the protective film operates.

As shown in FIG. 4A, a second insulating layer 20 of $SiO_2$ is formed on the first insulating layer 10, including the first layer of interconnections 15 and the protective film 17, for supporting interconnections of copper in an upper layer. At this time, the protective film 17 prevents the interconnections 15 from being oxidized.

Figure 4B:
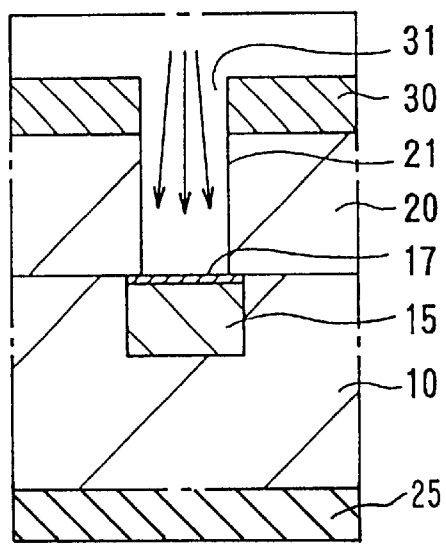

As shown in FIG. 4B, a resist layer 30 is formed on the upper surface of the insulating layer 20. Then an etchant of fluorine gas is applied to the insulating layer 20 through a hole 31 defined in the resist layer 30 for forming a hole 21 in the insulating layer 20, which will be filled with a plug 35 for connection to the interconnections 15. At this time, the etchant contacts the protective film 17, but not the interconnections 15. Therefore, the interconnection 15 is prevented from being modified by the etchant.

Figure 4C:
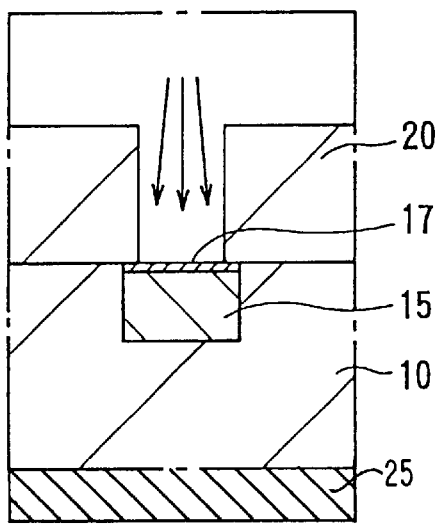

The resist layer 30 shown in FIG. 4B is then oxidized and removed by ashing, as shown in FIG. 4C. At this time, the protective film 17 prevents the interconnections 15 from being oxidized.

After a plug 35 is formed in the hole 21 in the insulating layer 20 and a second layer of interconnections 36 is embedded in the insulating layer 20, the overall surface of the insulating layer 20 is planarized by chemical mechanical polishing. If another insulating layer of $SIO_2$ is to be formed on the planarized insulating layer 20, then a protective layer of Ag 37 may be formed on the exposed upper surface of the next interconnections 36 by immersion plating.

Figure 4D:
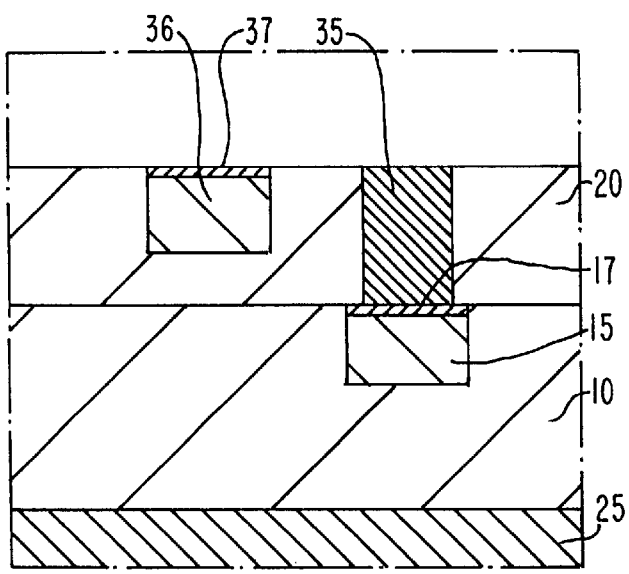

Thus, as shown in FIG. 4D, one embodiment of the present invention includes a plurality of insulating layers 10, 20, formed on a substrate 25. Each of the insulating layers 10, 20 has embedded interconnections of copper 15, 36. A protective film of silver 17, 37, is formed on each of the embedded interconnections of copper.

In the above embodiment, the overall upper surface of each of the insulating layers is planarized by chemical mechanical polishing. However, they may be planarized by any of various planarizing processes other than chemical mechanical polishing.

While the aqueous solution of silver cyanide is employed in the immersion plating process in the above embodiment, another solution such as an aqueous solution of silver nitrate may be employed in immersion plating.

The present invention offers the following advantages. The protective film of Ag on the exposed upper surface of the interconnections of Cu prevents the interconnections from being oxidized or modified. Therefore, the yield of the semiconductor devices will be improved, and the production throughput of semiconductor wafers will be increased.

Because the protective film of Ag is formed on the exposed upper surface of the connections of Cu by immersion plating, the protective film of Ag can be selectively formed only on the exposed surface of the interconnections of Cu without a mask. The protective film can have a very small thickness, which will reduce the amount of Ag that diffuses in the Cu interconnections. Hence, the electrical resistance of the interconnections will be prevented from increasing.

Although a certain preferred embodiment of the present invention has been shown and described in detail, it should be understood that various changes and modifications may be made therein without departing from the scope of the appended claims.

We claim:

1. A method of forming embedded interconnections of copper, comprising:

(a) forming an insulating layer;

(b) forming an embedded interconnection of copper in said insulating layer;

(c) planarizing an exposed surface of said insulating layer including an exposed surface of said embedded interconnections of copper; and (d) forming a protective film of silver on the exposed surface of said embedded interconnections of copper.

2. A method according to claim 1, further comprising:

(e) repeating said steps (a) through (d) on the existing insulating layer thereby to produce multiple layers of embedded interconnections of copper.

3. A method according to claim 1, wherein said step (d) comprises plating the exposed surface of said embedded interconnections of copper with silver according to plating.

4. A method according to claim 1, wherein said step (c) comprises planarizing the exposed surface of said insulating layer including the exposed surface of said embedded interconnections of copper according to chemical mechanical polishing.

* * * * *